United States Patent
Harland et al.

(10) Patent No.: US 11,889,652 B1
(45) Date of Patent: Jan. 30, 2024

(54) SERVER RACK ADAPTER

(71) Applicant: Amazon Technologies, Inc., Seattle, WA (US)

(72) Inventors: Jason Alexander Harland, Seattle, WA (US); Shreyas Sampath, Kirkland, WA (US); Hazel Aoife Flynn, Winchester, MA (US)

(73) Assignee: Amazon Technologies, Inc., Seattle, WA (US)

( * ) Notice: Subject to any disclaimer, the term of this patent is extended or adjusted under 35 U.S.C. 154(b) by 89 days.

(21) Appl. No.: 17/358,601

(22) Filed: Jun. 25, 2021

(51) Int. Cl.
*H05K 7/14* (2006.01)

(52) U.S. Cl.
CPC ......... *H05K 7/1492* (2013.01); *H05K 7/1487* (2013.01); *H05K 7/1489* (2013.01); *H05K 7/1491* (2013.01)

(58) Field of Classification Search
CPC ...... H05K 7/14; H05K 7/1457; H05K 7/1488; H05K 7/1489; H05K 7/1491; H05K 7/1492; H05K 5/03; H05K 7/20; H05K 7/20127; H05K 7/20136; H05K 7/20145; H05K 7/20154; H05K 7/20163; H05K 7/202; H05K 7/1425; H05K 7/1485; H05K 7/1487; H02M 7/44; G06F 21/86
USPC .................................................. 361/679.02
See application file for complete search history.

(56) References Cited

U.S. PATENT DOCUMENTS

| | | | | |
|---|---|---|---|---|
| 7,054,155 B1* | 5/2006 | Mease | ................ | H05K 7/20581 165/104.34 |
| 8,472,198 B2* | 6/2013 | Peng | ...................... | G06F 1/181 361/728 |
| 8,625,285 B2* | 1/2014 | Peng | .................... | H05K 7/1491 361/724 |
| 2005/0201073 A1* | 9/2005 | Pincu | ..................... | H04Q 1/023 361/797 |
| 2007/0242420 A1* | 10/2007 | Hoshino | .............. | G02B 6/4453 361/600 |
| 2010/0110628 A1* | 5/2010 | Barrenechea | ........ | H05K 7/1491 361/679.48 |
| 2011/0261526 A1* | 10/2011 | Atkins | ................. | H05K 7/1487 361/679.33 |
| 2013/0229780 A1* | 9/2013 | Trudeau | ................... | H04Q 1/13 361/827 |
| 2014/0268528 A1* | 9/2014 | Mick | .................... | H05K 7/1491 361/679.01 |

(Continued)

*Primary Examiner* — Adrian S Wilson
*Assistant Examiner* — Gage Crum
(74) *Attorney, Agent, or Firm* — Kilpatrick Townsend & Stockton LLP (57) ABSTRACT

A rack for a datacenter or other environment may define an internal width configured to receive rack-mounted units of a predetermined width. An adapter may enable operation with a computing appliance having a maximum width smaller than the predetermined width. The adapter can include a tray with a footprint having the predetermined width and a mount for supporting the computing appliance within the footprint of the tray. The tray may support a power inverter that receives from a direct current power supply and provides alternating current to the computing appliance. The tray may also support a patch panel having a network port accessible from a front of the tray. The patch panel can be communicatively coupled with the computing appliance to provide networking communication with the computing appliance through the second network port.

20 Claims, 4 Drawing Sheets

(56) References Cited

U.S. PATENT DOCUMENTS

| | | | |
|---|---|---|---|
| 2015/0090679 A1* | 4/2015 | Obernesser | A61M 31/007 |
| | | | 211/26 |
| 2017/0126143 A1* | 5/2017 | White | H04L 67/10 |
| 2017/0127552 A1* | 5/2017 | White | H05K 7/1492 |
| 2019/0146565 A1* | 5/2019 | Cader | H01M 8/04626 |
| | | | 307/23 |
| 2020/0229317 A1* | 7/2020 | Martinez | H05K 1/141 |
| 2020/0245491 A1* | 7/2020 | White | H04Q 1/13 |
| 2020/0349297 A1* | 11/2020 | Westphall | G06F 21/86 |

* cited by examiner

SERVER RACK ADAPTER

BACKGROUND

Datacenters house collections of servers and networking hardware, including switches and routers. Often datacenters may be outfitted with specialized components to perform particular functions and/or to achieve certain efficiencies. However, in some situations, specialized components may have unique form factors that may limit interoperability with other components of a different form factor.

BRIEF DESCRIPTION OF THE DRAWINGS

Various embodiments in accordance with the present disclosure will be described with reference to the drawings, in which.

DETAILED DESCRIPTION

Techniques described herein can relate to adapter assemblies that can facilitate interoperability with different sizes and/or varieties of rack-mounted units. A rack for a datacenter or other environment may include certain features to accommodate a particular complementary type of counterpart corresponding server or other rack-mounted unit. For example, the rack can be arranged to primarily accommodate a particular size, such as a 21-inch server. In addition, the rack may include a power supply system that can provide power as direct current (DC) to corresponding servers received in the rack. For example, the corresponding servers may include suitable connectors to accept 12 Volt direct current power (or other level provided). The rack may further be arranged to accommodate network ports that may be positioned on a front end of the corresponding servers.

To accommodate other or variant forms of servers or rack-mounted units that may not include or match all features of the corresponding servers, an adapter can be provided. For example, the adapter may accommodate variant servers that may be a different size and/or that may have different power and/or network connection arrangements in comparison to the corresponding servers.

The adapter can include a tray with a footprint that can fit the rack. For example, the tray may be sized to approximate the width of 21-inch server body and/or other relevant dimension of a corresponding server. The adapter can also include rails or other mounts to position and/or secure a smaller variant server (e.g., a 19-inch server) within the footprint of the adapter tray, e.g., so that the smaller variant server can be adequately received and/or supported by the rack.

In addition, the adapter can include an onboard power inverter. The power inverter may receive DC power from the rack's direct current power supply system (e.g., at 12 Volt DC or other amount) and provide a suitable alternating current (AC) output (e.g., at 240 Volt AC or other amount) for the variant server received in the adapter.

The adapter can further include a patch panel that can be arranged to provide a suitable network connection for interoperability regardless of the interfaces present on the variant server. For example, at a front end, the patch panel may include a network port positioned within the adapter at a similar position to a position of network ports of corresponding servers to be received within the rack. At an opposite end, the patch panel can include suitable connectors for reaching and/or engaging with the variant server. For example, whereas a front side of the patch panel may include a forward-facing QSFP port consistent with similar ports on corresponding servers, a rear side of the patch panel may feature SFP ports that may allow connection with similar ports on the variant servers. The patch panel may also be arranged so that cabling can be readily run from the rear of the patch panel to reach the location of interfaces on the variant server (e.g., regardless of whether at a front or rear).

In use, the rack may be utilized with corresponding servers and/or with variant servers connected through adapters, which may improve interoperability options for the rack.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Figure 1:
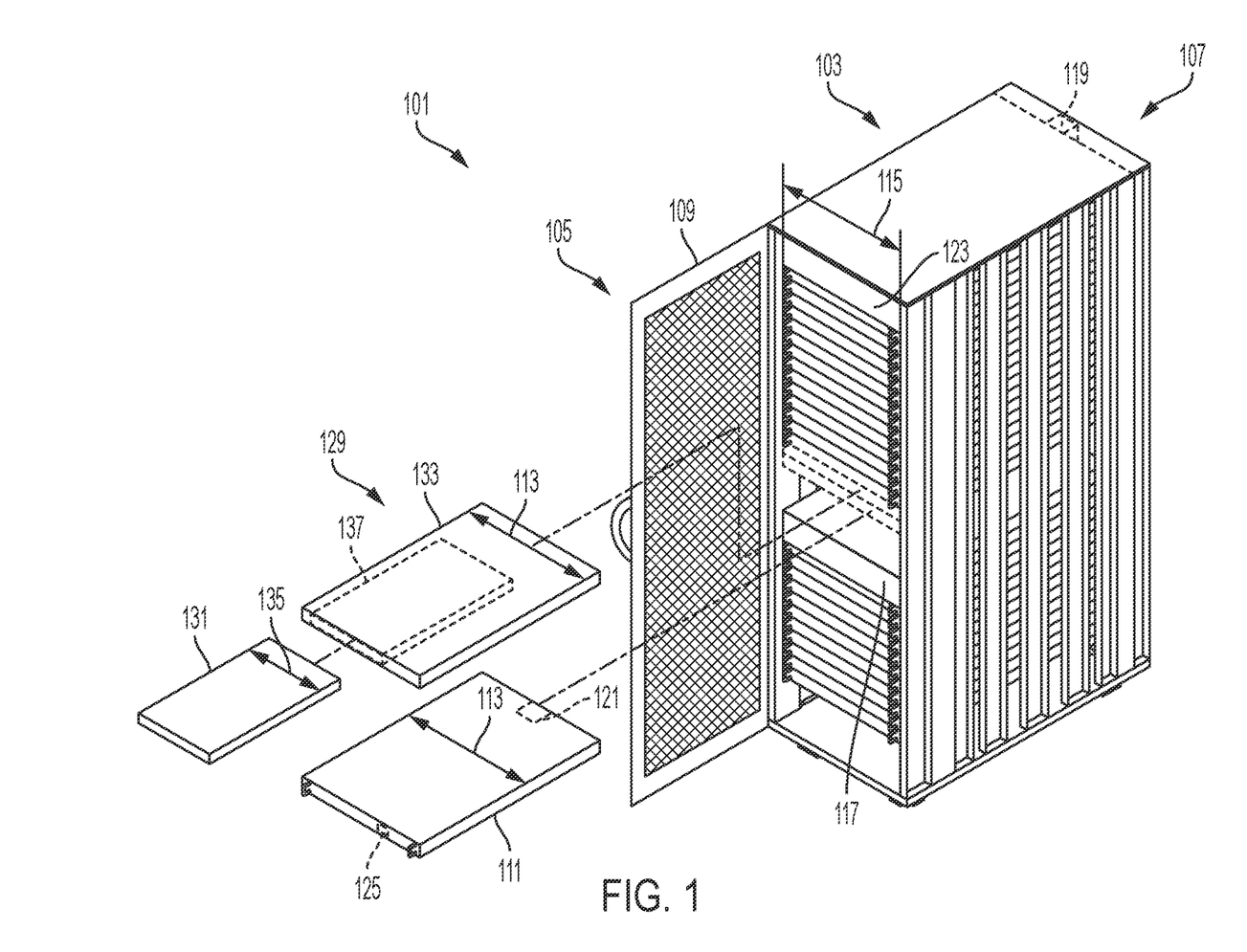
FIG. 1 is a perspective view showing a system with a rack and adapter assembly according to various embodiments.

FIG. 1 illustrates a system 101 according to various embodiments. The system 101 may be utilized in a datacenter or other environment. The system 101 may be implemented in a location maintained by a service provider and/or in a location maintained by customer, for example.

The system 101 may include a rack 103, which may correspond to a server rack, for example. The rack 103 can include any suitable arrangements of structural support and/or panels. For example, the rack 103 can include vertical members, horizontal members, and/or any other suitable structure for supporting rack-mounted units. The rack 103 can form an enclosure about rack-mounted units.

The rack 103 can define suitable directions and/or orientations. For example, the rack 103 can include a front 105 and a rear 107. In FIG. 1, the rack 103 is depicted with a door 109 along the front 105 of the rack 103. The door 109 may be securable relative to other elements of the rack 103, for example, to secure components within the rack 103. In addition or alternatively, the rack 103 may include a similar door 109 or other suitable structure at the rear 107 of the rack 103.

The rack 103 may be sized to accommodate rack-mounted units of a predetermined size. As one example of a suitable rack-mounted unit, FIG. 1 is depicted with a first computing appliance 111, which may correspond to a server, for example. The first computing appliance 111 is shown with a first predetermined width 113. The predetermined width 113 may correspond to a standardized server size. For example, the predetermined width 113 in some embodiments may be approximately 21 inches, although other sizes and/or widths may be utilized. The rack 103 may have an internal width 115 configured to receive the first computing appliance 111 or other rack-mounted unit of the predetermined width 113. For example, the rack 103 may be configured to receive 21-inch servers, although other sizes and/or widths may be utilized.

The server rack 103 may include or be associated with suitable features for facilitating functions of the system 101. For example, the system 101 may include a direct current power supply 117. The direct current power supply 117 is depicted as a box received within the server rack 103 and more specifically in a middle portion of the rack 103, although the direct current power supply 117 may be positioned at any suitable vertical or other location inside, outside, or otherwise relative to the rack 103.

The direct current power supply 117 may provide direct current power to suitable locations in the rack 103 by any suitable structure. As an example, the direct current power supply 117 may provide 12 Volt direct current power, although other levels or amounts may be utilized. The direct current power supply 117 can be engageable along the rear 107 of the rack 103. As an example, the direct current power supply 117 is shown with a backplane conduit 119 with suitable junctures for engagement by individual rack-mounted units along the rear 107 of the rack 103, although any other structure may be utilized to provide connection points or interfaces for delivery of power.

The first computing appliance 111 may be received within the rack 103, which may allow engagement with the direct current power supply 117, e.g., along the rear of the rack 103. The first computing appliance 111 can include suitable power connectors 121 for engaging or coupling with the direct current power supply 117. In some embodiments, the power connectors 121 can include blind-mate connectors that can engage with the backplane conduit 119 or other suitable structure for delivery of power from the direct current power supply 117.

The rack 103, the first computing appliance 111, and/or other elements of the system 101 may include suitable interfaces and/or components for network connections. As one example, the rack 103 is shown with a network switch 123 at or adjacent a top of the rack 103, although the network switch 123 may be supplemented or replaced with one or more switches in another part of the rack 103 or elsewhere in the system 101. The first computing appliance 111 is shown having a first networking port 125, which may be accessible from the front 105 of the rack 103. In use, the first networking port 125 may be connected by cabling (not shown) to the network switch 123 and/or other elements received within the rack 103 and/or elsewhere in the system 101, e.g., to enable networking connections among different computing components for transfer of data etc.

The first networking port 125 may be one of various ports in the system 101 that can include any suitable form factor and may differ from or be alike to one another. Such ports may correspond to any suitable form factor of pluggable module, pluggable media, pluggable transceiver, or other pluggable component. For example, one or more of the ports may be sized and arranged to meet any suitable standard for pluggable optical transceivers. In one non-limiting example, one or more of the ports may correspond to a small form-factor pluggable (SFP) transceiver, such as is commonly used for telecommunication and/or data communications applications. In another non-limiting example, one or more of the ports comprises an enhanced small form-factor pluggable (SFP+) transceiver or a compact small form-factor pluggable (CSFP) transceiver. In an additional non-limiting example, one or more of the ports comprises an RJ45 connector or a similar connector. Further non-limiting examples may include QSFP, QSFP+, QSFP28, QSFP56, QSFP56-DD, OSFP, or other standards that may be known in the art.

The system 101 can further include an adapter assembly 129. The adapter assembly 129 can include a second computing appliance 131 and an adapter 133. The adapter 133 may be configured for receipt in the rack 103. For example, the adapter may be sized to have or match the predetermined width 113. The adapter 133 may enable the rack 103 to operate with the second computing appliance 131, e.g., notwithstanding that the second computing appliance 131 may be smaller than the first computing appliance 111. For example, the second computing appliance 131 may have a maximum width 135 that is smaller than the predetermined width 113.

In operation, the second computing appliance 131 may be received into the adapter 133 in a receiving zone 137 (e.g., shown in dashed lines in FIG. 1). The adapter 133 and/or the second computing appliance 131 may include additional features to facilitate interoperability of the second computing appliance 131 with other features of the system 101 and/or rack 103. Some examples are described further with respect to FIGS. 2-5.

Figure 2:
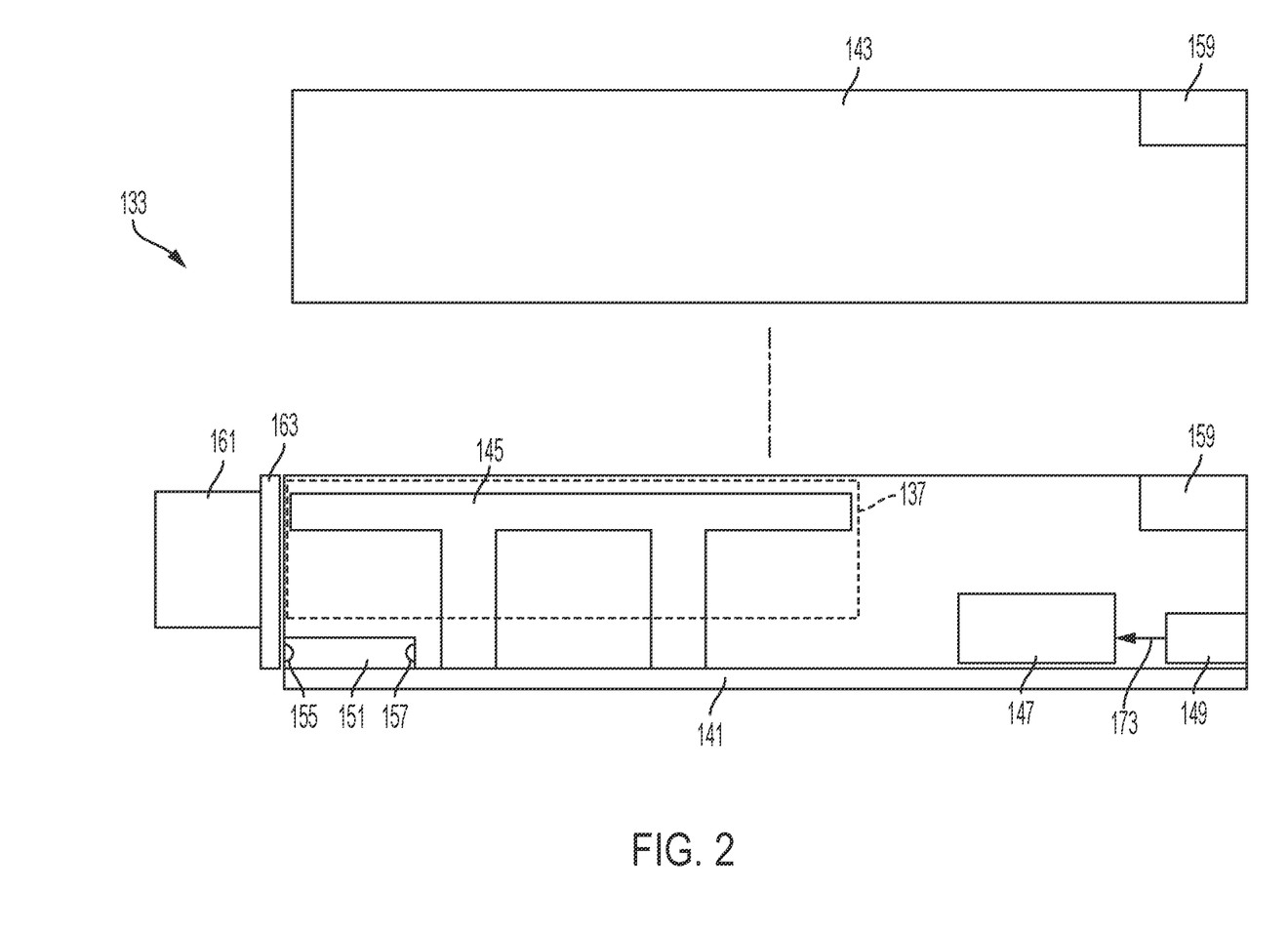
FIG. 2 is a side view showing an adapter that may be utilized in the system of FIG. 1 according to various embodiments.

FIG. 2 illustrates a side view of the adapter 133 according to various embodiments. The adapter 133 can include a tray 141. The tray 141 may be coupled with a lid 143. For example, the tray 141 and lid 143 may be coupled so that side walls of the tray 141 and/or of the lid 143 enclose components within an internal volume defined by the adapter 133. The tray 141 can include a footprint within which or relative to which other components or parts can be received or situated in use. For example, the footprint of the tray 141 may include or approximate the predetermined width 113 (FIG. 1).

As depicted by way of example in FIG. 2, the adapter 133 can include a mount 145. The mount 145 is depicted as a set of uprights and rails that can support the second computing appliance 131 within the receiving zone 137, although the mount 145 may correspond to any other suitable structure configured to receive and/or position the second computing appliance 131 within the footprint of the tray 141. The mount 145 may be configured to receive the second computing appliance 131 into a received state in which the second computing appliance 131 is supported within the footprint of the tray, for example. The mount 145 may be integrally formed with the tray 141, coupled with the tray 141, or correspond to an area or region of the tray 141 capable of supporting the second computing appliance 131. For example, although the mount 145 is depicted in FIG. 2 such that the receiving zone 137 is spaced above a surface of the tray 141, other arrangements can be utilized and may include arrangements in which the receiving zone 137 is aligned or abutting against a surface of the tray 141.

The adapter 133 can further include a power inverter or other power component 147. As non-limiting examples, the power component 147 may correspond to an inverter, an adapter, and/or a converter and/or may perform functions such as inverting between alternating current and direct current, stepping voltage up or down, or otherwise transforming power from a given input state to a suitable output state for interoperability with other components such as the second computing appliance 131. The power component 147 may be supported by the tray 141. The power component 147 may be a separate or distinct component from the second computing appliance 131. The power component 147 may be arranged to receive direct current. For example, the power component 147 may receive direct current from the direct current power supply 117.

The power component 147 may be associated with suitable structure for receiving power from the direct current power supply 117. For example, a connector 149 may be included in the tray 141. The connector 149 may be coupled with the power component 147 (e.g., as illustrated by arrow 173), such as by being a portion of the power component 147 or by being coupled by suitable cabling or other power conduit. The connector 149 may engage the backplane conduit 119 or other intervening structure for coupling with and/or engaging the direct current power supply 117. The connector 149 may correspond to a blind-mate connector, for example. In some examples, the connector 149 may include prongs or other suitable structure for engaging vertical copper bars that may be present in the backplane conduit 119, for example.

The power component 147 may be capable of converting received direct current power into alternating current power. For example, such conversion may be useful for providing power to the second computing appliance 131, which may be configured to receive alternating current power.

The adapter 133 can further include a patch panel 151. The patch panel 151 may be supported by the tray 141. The patch panel 151 may be a distinct and/or separate part from the second computing appliance 131. The patch panel 151 can include a second network port 155 accessible from the front 105 of the rack 103. The patch panel 151 may facilitate provision of networking communication from the second computing appliance 131, e.g., as in examples described further below with respect to FIGS. 3 and 4.

Referring further to FIG. 2, the patch panel 151 can include a first network connector 157 that may facilitate communicative coupling with the second computing appliance 131. The first network connector 157 and/or the second network port 155 may be any of the types of ports referenced above for the first network port 125. Moreover, the first network connector 157 and/or the second network port 155 may be of a same or different type relative to each other and/or relative to the first network port 125.

As further depicted by way of example in FIG. 2, the adapter 133 may include a security unit 159 on the tray 141 and/or on the lid 143. In operation, the security unit 159 may allow for detection of tampering with the adapter 133 after the adapter 133 has been fully assembled and/or installed. For example, the security unit 159 may include near-field-communication components and/or other devices that can be capable of detecting the coupling of the lid 143 with the tray 141 (and/or installation of the adapter 133 relative to the rack 103). Additionally or alternatively, the security unit 159 may be capable of detecting separation of the lid 143 and tray 141 or any other relevant change after installation that may correspond to tampering. The security unit 159 may facilitate confirmation of whether a unit deployed to a customer or other installation site has been tampered with during transit to, during transit from, or while at the installation site, e.g., which may allow a determination of whether a set of components within the adapter 133 may be suitable for refurbishing and/or reuse in another environment.

The adapter 133 in FIG. 2 is also shown with a thermal control unit 161. The thermal control unit 161 may be arranged at a suitable location for controlling thermal characteristics of an environment within the adapter 133. For example, the thermal control unit 161 may correspond to a set of one or more fans, refrigeration conduits, heat exchangers, fins, heaters, coolers, and/or other structure that may cool air or other mediums that may be transported into or out of the adapter 133 for temperature control of elements therein.

The thermal control unit 161 is shown in FIG. 2 attached via a coupler 163. The coupler 163 may correspond, for example, to a swinging door that may swing from the front of the adapter 133 to permit insertion of the second computing appliance 131 into the receiving zone 137. Additionally or alternatively, the coupler 163 may include a bezel or other releasable connector that may allow the thermal control unit 161 to be releasably detached in a swinging, translating, or other motion from the adapter 133 to permit access to the receiving zone 137.

The adapter 133 can facilitate use of different configurations of the second computing appliance 131. Some examples are described further with respect to FIGS. 3 and 4. For ease of viewing other components, some components represented in FIG. 2 (such as the lid 143, the thermal control unit 161, and the coupler 163) are omitted from view in other figures but may nevertheless be present or absent in use.

Figure 3:
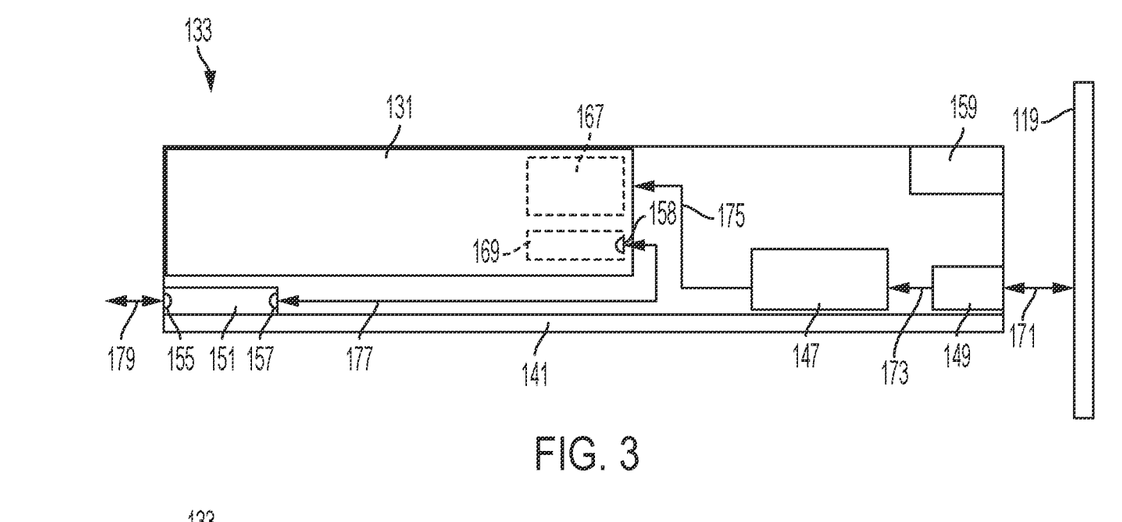
FIG. 3 is a side view showing the adapter of FIG. 2 with a first configuration of a computing appliance installed according to various embodiments.

FIG. 3 depicts the adapter 133 with a first configuration of the second computing appliance 131 installed. The second computing appliance 131 can include an internal power supply unit 167 and a network card 169. In the arrangement depicted in FIG. 3, the power supply unit 167 and the network card 169 are each shown positioned at a rear of the second computing appliance 131 (or rear-facing), although other relative arrangements can also be utilized.

The power supply unit 167 may be configured to receive alternating current power and supply power (e.g., as alternating current or converted into direct current) to components within the second computing appliance 131. As an example, the power supply unit 167 may be configured to receive 240 Volt alternating current, although other levels or amounts may be utilized.

The network card 169 may include a second network connector 158. The second network connector 158 may be any of the types of ports referenced above for the first network port 125. Moreover, the second network connector 158 may be of a same or different type relative to any and/or all of the first network port 125, the first network connector 157, and/or the second network port 155. As an illustrative example, in a scenario in which the first computing appliance 111 features a QSFP configuration for the first network port 125, the patch panel 151 may be configured such that the second network port 155 along the front is also a QSFP type to match. Continuing this illustrative example from the opposite direction, the second computing appliance 131 may be configured such that the second network connector 158 features a SFP interface, and as a result, the other side (e.g., rear side) of the patch panel 151 may be configured so that the corresponding first network connector 157 is formed as a port or breakout cable with SFP connectors to match.

In operation, the second computing appliance 131 may be connected with parts of the adapter 133, which may be connected in turn with other parts of the system 101 to facilitate operation of the second computing appliance 131 within the system 101. For example, the adapter 133 may be engaged (e.g., as at arrow 171) with the backplane conduit 119, or with other structure for engaging with the direct current power supply 117. Such connection may occur via the connector 149, for example. As a result of suitable connection, direct current power may be supplied (as illustrated by arrow 173) to the power component 147.

The power component 147 may convert the direct current power received into alternating current. The alternating current can be provided or supplied (e.g., as illustrated by arrow 175) to the power supply unit 167 of the second computing appliance 131. As an illustrative example, the power component 147 may convert 12 Volt direct current to 240 Volt alternating current, although other levels or amounts may be utilized.

The power supply unit 167 within the second computing appliance 131 may receive the alternating current power from the power component 147. With the alternating current power received, the power supply unit 167 may provide power within the second computing appliance 131 in a manner suitable for operation of the second computing appliance 131. For example, powering the second computing appliance 131 may facilitate networking communication to be transmitted relative to the network card 169 of the second computing appliance 131.

The network card 169 of the second computing appliance 131 can be communicatively coupled with the patch panel 151 (such as illustrated by arrow 177). For example, the second network connector 158 of the network card 169 of the second computing appliance 131 can be connected with the first network connector 157 of the patch panel 151.

In turn, the patch panel 151 and the second networking port 155 can facilitate networking communication relative to the second computing appliance 131. For example, the patch panel 151 and the second networking port 155 may establish networking connection (e.g., as illustrated by the arrow 179) between the second computing appliance 131 and other elements outside of the adapter 133, such as the network switch 123, the first computing appliance 111, and/or other elements within the rack 103 and/or within the system 101.

The arrows 171, 173, 175, 177, and 179 may correspond to cabling and/or other suitable connectors among the coupled components. Data connectors may correspond to any of the types of ports referenced above for the first network port 125, for example.

Figure 4:
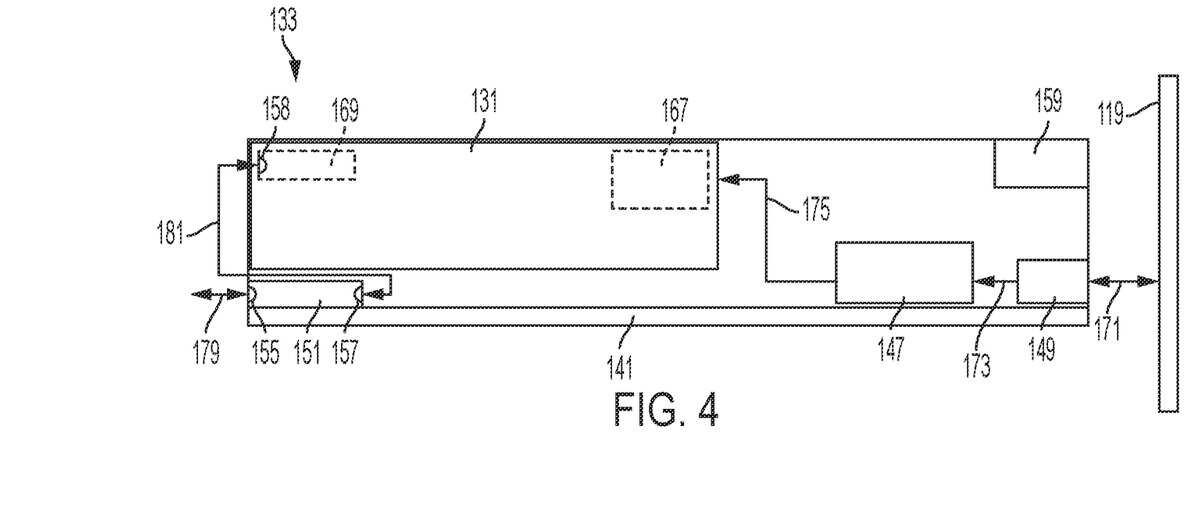
FIG. 4 is a side view showing the adapter of FIG. 2 with a second configuration of a computing appliance installed according to various embodiments.

FIG. 4 illustrates an example in which the second computing appliance 131 is arranged in a different configuration than that described for FIG. 3. In FIG. 4, the network card 169 for the second computing appliance 131 is instead shown positioned along a front of the second computing appliance 131 (or front-facing). The patch panel 151 may facilitate networking communication, such as illustrated by arrow 181. The arrow 181 in FIG. 4 (e.g., like the arrow 177 in FIG. 3) may correspond to suitable cabling and/or connectors. For example, the network card 169 and the patch panel 151 may engage or connect suitable interfaces, such as those described above with respect to FIG. 3. As may be appreciated (e.g., by reference to arrow 181), the network card 169 and the patch panel 151 may be coupled by cabling that crosses a boundary of the tray 141, such as by passing or being routed out of a front of the tray 141. Other features in FIG. 4 are identified with similar numbers as in FIG. 3 and may correspond to similar structures, so for conciseness, additional descriptions of such elements are not repeated. Generally, the patch panel 151 may provide flexibility that may permit the adapter 133 to function regardless of whether the second computing appliance 131 includes the network card 169 at a front, a rear, or another location.

Figure 5:
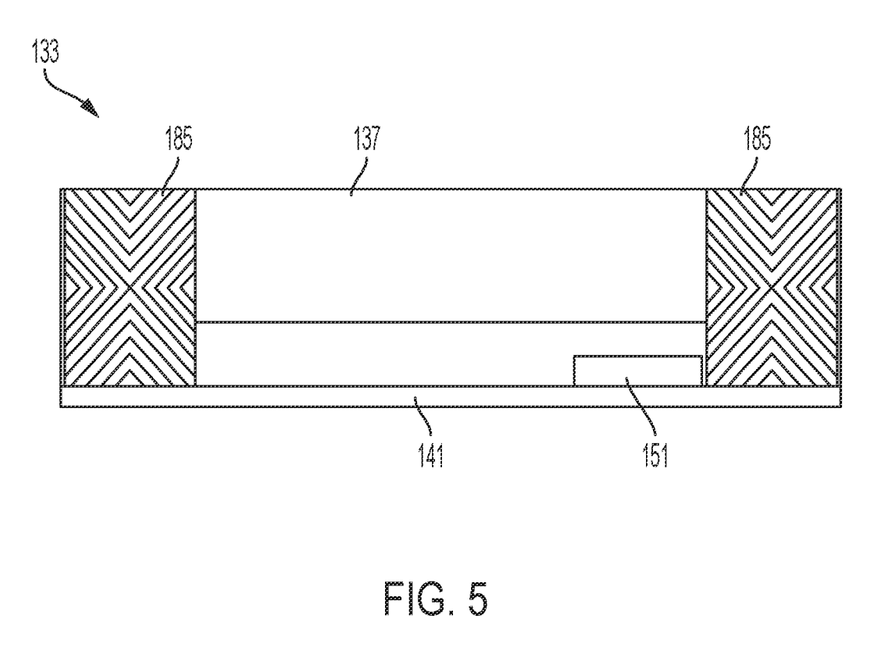
FIG. 5 is a front end view of the adapter of FIG. 2 according to various embodiments.

FIG. 5 illustrates a front end view of the adapter 133. Various components discussed in relation to earlier figures are omitted for clarity of the view in FIG. 5. The tray 141 of the adapter 133 may include one or more suitable thermal barriers 185. In use, the thermal barriers 185 may permit cabling or other structures to pass through a front of the adapter 133. The thermal barriers 185 may readjust or realign around such extending structures to seal or conform around such extending structures and block airflow or leakage about such structures. For example, the thermal barriers 185 are depicted as brush guards having bristles that extend across a space and block airflow, yet which also exhibit both (i) a suitable flexibility to allow cables etc. to be passed through, and (ii) a suitable resilience to conform around passed-through cables to block airflow alongside the passed-through cables. Additionally or alternatively, the thermal barriers 185 may include overlapping membranes or any other suitable structure that may block airflow.

Although the thermal barriers 185 are shown in FIG. 5 along the lateral edges of the tray 141, the thermal barriers 185 may extend across upper edges, bottom edges, or any suitable position to prevent airflow through a cross-sectional face that is not occupied by other components or features such as the patch panel 151 or the receiving zone 137 (e.g., which in use may be sufficiently occupied by the second computing appliance 131). In addition, although the patch panel 151 is shown extending across a sub-part of the horizontal distance of the tray 141, the patch panel 151 may extend substantially across a complete distance between thermal barriers, may be arranged in an upright orientation (such as adjacent to the receiving zone 137 and/or behind a thermal barrier 185), and/or in any other suitable location.

Based on the disclosure and teachings provided herein, a person of ordinary skill in the art will appreciate other ways and/or methods to implement the various embodiments. The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Various embodiments of this disclosure are described herein, including the best mode known to the inventors for carrying out the disclosure. Variations of those embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. A server rack assembly for a datacenter, the server rack assembly comprising: a server rack having a front and a rear and defining an internal width configured to receive rack-mounted units of a predetermined width; a direct current power supply engageable along the rear of the server rack; a first server having the predetermined width, received within the server rack, engaged with the direct current power supply along the rear of the server rack, and having a first network port accessible from the front of the server rack; and an adapter assembly comprising a second server and an adapter, the second server having a maximum width smaller than the predetermined width, the second server configured to receive alternating current power, and the adapter comprising: a tray with a footprint having the predetermined width and a predetermined length, the tray including a pair of sidewalls extending along a predetermined height and the predetermined length, a first surface extending along the predetermined width and the predetermined length, and a receiving area offset from the first surface within the tray, the receiving area configured for receiving the second server offset from the first surface; a mount positioned between the pair of sidewalls and extending from the first surface into the receiving area and along a length direction, and the mount configured to support the second server within the footprint of the tray and within the receiving area offset from the first surface within the tray; a power inverter supported by the tray, the power inverter coupled to the direct current power supply and arranged to provide alternating current to the second server; and a patch panel supported by the first surface of the tray and disposed below the receiving area, the patch panel having a second network port accessible from the front of the server rack, the patch panel being communicatively coupled with the second server to provide networking communication from the second server through the second network port.

2. The server rack assembly of claim 1, wherein the patch panel is communicatively coupled with the second server by cabling extending from the patch panel to a front-facing or rear-facing network card of the second server.

3. The server rack assembly of claim 1, wherein the direct current power supply is engageable along the rear of the server rack via a backplane conduit.

4. The server rack assembly of claim 1, wherein the second network port of the patch panel comprises a QSFP port, and wherein the patch panel is communicatively coupled with the second server by a SFP port of the second server.

5. An adapter assembly for receipt into a rack, the rack configured to receive rack-mounted units of a predetermined width, the adapter assembly comprising: a computing appliance having a maximum width smaller than the predetermined width; and an adapter comprising: a tray with a footprint having the predetermined width and a predetermined length, the tray including a pair of sidewalls extending along a predetermined height and the predetermined length, a first surface extending along the predetermined width and the predetermined length, and a receiving area vertically offset from the first surface within the tray, the receiving area configured for receiving the computing appliance offset from the first surface; a mount positioned between the pair of sidewalls and extending from the first surface into the receiving area and along a length direction, and the mount configured to support the computing appliance within the footprint of the tray and within the receiving area offset from the first surface within the tray; a power component supported by the tray, the power component coupled to a power supply and arranged to provide power to the computing appliance; and a patch panel supported by the tray, the patch panel having a network port accessible from a front of the tray, the patch panel being communicatively coupled with the computing appliance to provide networking communication with the computing appliance through the network port.

6. The adapter assembly of claim 5, wherein the network port accessible from the front of the tray is of a first type of network interface that differs from a second type of network interface by which the computing appliance is communicatively coupled with the patch panel.

7. The adapter assembly of claim 6, wherein the second type of network interface is present on the patch panel.

8. The adapter assembly of claim 6, wherein the second type of network interface is present on the computing appliance.

9. The adapter assembly of claim 6, wherein the power component is arranged to receive from the power supply via a blind-mate connector.

10. The adapter assembly of claim 6, wherein the power component is configured to receive 12 Volt direct current and supply 240 Volt alternating current.

11. The adapter assembly of claim 6, further comprising the rack.

12. The adapter assembly of claim 11, wherein the adapter assembly is included in a server rack assembly for a datacenter;
   wherein the rack is a server rack that has a front and a rear;
   wherein the server rack assembly includes the server rack and the power supply;
   wherein the power supply comprises a direct current power supply engageable along the rear of the server rack;
   wherein the power component comprises a power inverter coupled to the direct current power supply and arranged to provide alternating current to the second server;
   wherein the computing appliance is a second server configured to receive alternating current power;
   wherein the network port of the patch panel is a second network port; and
   wherein the server rack assembly further includes a first server having the predetermined width, received within the server rack, engaged with the direct current power supply along the rear of the server rack, and having a first network port accessible from the front of the server rack.

13. An adapter for a computing appliance, the adapter comprising: a tray with a footprint having a predetermined width and a predetermined length, the predetermined width sized to be mounted within a server rack, the tray including a pair of sidewalls extending along a predetermined height and the predetermined length, a first surface extending along the predetermined width and the predetermined length, and a receiving area vertically offset from the first surface within the tray, the receiving area configured for receiving the computing appliance offset from the first surface; a mount positioned between the pair of sidewalls and extending from the first surface into the receiving area and along a length direction aligned with the predetermined length, the mount configured to receive the computing appliance into a received state in which the computing appliance is supported within the footprint of the tray and within the receiving area offset from the first surface within the tray, the computing appliance having a maximum width smaller than the predetermined width; a power component supported by the tray, the power component configured to couple to a power supply and provide power to the computing appliance in the received state; and a patch panel supported by the tray, the patch panel having a network port accessible from a front of the tray, the patch panel configured for communicatively coupling with the computing appliance in the received state to provide networking communication with the computing appliance through the network port.

14. The adapter of claim 13, further comprising a lid configured to engage the tray and enclose components within an internal volume defined by the adapter.

15. The adapter of claim 14, further comprising a security unit coupled with at least one of the tray or the lid and configured to detect separation of the lid and the tray corresponding to tampering with the adapter after the lid and the tray have been coupled together.

16. The adapter of claim 13, further comprising a thermal control unit arranged for controlling thermal characteristics of an environment within the adapter.

17. The adapter of claim 16, wherein the thermal control unit is detachably coupled via a coupler along a front of the adapter to facilitate insertion of the computing appliance into the received state.

18. The adapter of claim 13, further comprising at least one thermal barrier arranged along a front of the adapter and configured to block airflow therethrough and to permit passage of cabling therethrough.

19. The adapter of claim 13, further comprising at least one of the rack or the computing appliance.

20. The adapter of claim 13, wherein the adapter is included in an adapter assembly that includes the computing appliance, wherein the adapter assembly is included in a server rack assembly for a datacenter;
  wherein the rack is a server rack that has a front and a rear;
  wherein the server rack assembly includes the server rack and the power supply;
  wherein the power supply comprises a direct current power supply engageable along the rear of the server rack;
  wherein the power component comprises a power inverter coupled to the direct current power supply and arranged to provide alternating current to the second server;
  wherein the computing appliance is a second server configured to receive alternating current power;
  wherein the network port of the patch panel is a second network port; and
  wherein the server rack assembly further includes a first server having the predetermined width, received within the server rack, engaged with the direct current power supply along the rear of the server rack, and having a first network port accessible from the front of the server rack.

* * * * *

UNITED STATES PATENT AND TRADEMARK OFFICE
CERTIFICATE OF CORRECTION

PATENT NO. : 11,889,652 B1
APPLICATION NO. : 17/358601
DATED : January 30, 2024
INVENTOR(S) : Jason Alexander Harland et al.

Page 1 of 1

It is certified that error appears in the above-identified patent and that said Letters Patent is hereby corrected as shown below:

In the Claims

Column 9, Line 24, Claim 1:
Delete: "fora"
Add: for a

Column 11, Line 4, Claim 13:
Delete: "fora"
Add: for a

Signed and Sealed this
Thirteenth Day of May, 2025

Coke Morgan Stewart
*Acting Director of the United States Patent and Trademark Office*